United States Patent
Ban et al.

(10) Patent No.: US 8,359,735 B2
(45) Date of Patent: Jan. 29, 2013

(54) HEAD ASSEMBLY FOR CHIP MOUNTER

(75) Inventors: Jong-Eok Ban, Seongnam-si (KR); Seong-Ku Kim, Seongnam-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 106 days.

(21) Appl. No.: 12/761,603

(22) Filed: Apr. 16, 2010

(65) Prior Publication Data

US 2010/0263203 A1    Oct. 21, 2010

(30) Foreign Application Priority Data

Apr. 17, 2009  (KR) .................. 10-2009-0033722

(51) Int. Cl.
*B23P 19/00* (2006.01)

(52) U.S. Cl. ............ 29/740; 29/739; 29/743; 29/759; 29/721; 29/833; 294/185

(58) Field of Classification Search ............ 29/832–834, 29/739–743, 705, 719–722, DIG. 44; 356/396, 356/602; 294/64.1, 8.6, 185–188; 716/4; 382/146–151

See application file for complete search history.

(56) References Cited

U.S. PATENT DOCUMENTS

| | | | | |
|---|---|---|---|---|
| 5,224,262 A * | 7/1993 | Takaichi et al. | ............... | 29/721 |
| 5,541,834 A * | 7/1996 | Tomigashi et al. | ............ | 700/59 |
| 7,089,656 B2 * | 8/2006 | Nagao et al. | .................... | 29/740 |
| 7,458,147 B2 * | 12/2008 | Kawase et al. | .................. | 29/833 |
| 7,559,134 B2 * | 7/2009 | Gaida | ............................ | 29/720 |
| 7,706,595 B2 * | 4/2010 | Bushman et al. | ............. | 382/141 |
| 2003/0110610 A1 * | 6/2003 | Duquette et al. | ........... | 29/407.09 |
| 2005/0117797 A1 * | 6/2005 | Gaida | .......................... | 382/153 |

FOREIGN PATENT DOCUMENTS

| | | |
|---|---|---|
| CN | 1758016 A | 4/2006 |
| JP | 10-068614 A | 3/1998 |
| JP | 10-078309 A | 3/1998 |
| JP | 2000-312100 A | 11/2000 |
| JP | 2000-349500 A | 12/2000 |
| JP | 2004-172465 A | 6/2004 |
| JP | 2005-101211 A | 4/2005 |
| KR | 10-1993-0016785 B1 | 8/1993 |
| KR | 10-2005-113602 A | 12/2005 |

OTHER PUBLICATIONS

First Office Action from the State Intellectual Property Office of P.R. China; issued Aug. 12, 2011 in corresponding Chinese Patent Application No. 201010167418.3.

* cited by examiner

*Primary Examiner* — Minh Trinh

(74) *Attorney, Agent, or Firm* — Sughrue Mion, PLLC

(57) ABSTRACT

A head assembly for a chip mounter is provided. The head assembly includes a nozzle module disposed above a printed circuit board (PCB) and configured to pick up and move an electronic component to mount the electronic component on the PCB, and a component recognition module electrically connected to the nozzle module and configured to recognize presence of the electronic component, a distance between the PCB and the nozzle module, and alignment of the electronic component at least one given moving position of the electronic component.

9 Claims, 6 Drawing Sheets

HEAD ASSEMBLY FOR CHIP MOUNTER

CROSS-REFERENCE TO RELATED PATENT APPLICATION

This application claims priority from Korean Patent Application No. 10-2009-0033722, filed on Apr. 17, 2009, the disclosure of which is incorporated herein in its entirety by reference.

BACKGROUND

1. Field

Apparatuses consistent with the present inventive concept relate to a head assembly for a chip mounter, and more particularly, to a head assembly for a chip mounter capable of recognizing presence of an electronic component sucked by a nozzle, posture of the electronic component, and a distance between the nozzle and a mounting position of a printed circuit board (PCB) on which the electronic component is mounted.

2. Description of Related Art

In general, a chip mounter is an apparatus for mounting components such as a semiconductor package, etc., on a PCB. In recent times, the PCB has high performance, and thus, electronic components mounted on the PCB also have high performance.

Therefore, the number of output pins mounted on the PCB increases, and thus, intervals between the output pins further decrease.

For this reason, before mounting an electronic component on the PCB, the electronic component must be precisely positioned to be accurately mounted on the PCB.

In order to precisely mount the electronic component on a predetermined position, a suction state and a center position of the component must be precisely determined before the component supplied from a component supplier is mounted on the PCB. For this purpose, a component recognition apparatus is used.

A related art component recognition apparatus installed at a chip mounter determines an X-Y position of an electronic component 50 using a lower surface image of the electronic component 50 as shown in FIG. 1, and measures a posture or alignment and a height of the electronic component 50 using side surface images of the electronic component 50. That is, as illustrated in FIG. 1, in order to obtain side and lower surface images of the electronic component 50, two cameras 61 and 62 are disposed parallel to each other. A reference numeral 90 designates a nozzle, and a reference numeral 63 designates a mirror.

Although not shown, another related art component recognition apparatus projects a laser beam onto a PCB and introduces an image thereof into a sensor to measure a height of the PCB.

That is, in a related art, while one apparatus having the two cameras 61 and 62 as shown in FIG. 1 is required to recognize lower and side surface images of the electronic component 50, an additional apparatus is also required to measure the height of the PCB using a separate sensor.

In addition, since the position of the electronic component and a projected point of the laser beam are different from each other, it is difficult to precisely measure the height of the PCB at a position on which the electronic component is mounted.

SUMMARY

Exemplary embodiments provide a head assembly for a chip mounter capable of recognizing presence of an electronic component sucked by a nozzle and posture of the electronic component based on a lower surface and side surfaces of the electronic component, and recognizing a distance between the nozzle and a mounting position of a PCB on which the electronic component is mounted.

Exemplary embodiments are also directed to operations of the head assembly for a chip mounter.

According to an exemplary embodiment, the head assembly for a chip mounter includes a nozzle module disposed above a PCB and configured to suck and move an electronic component to mount the electronic component on the PCB; and a component recognition module electrically connected to the nozzle module and configured to recognize presence of the electronic component, a distance between the PCB and the nozzle module, and alignment of the electronic component at least one given moving position of the electronic component.

Here, the nozzle module may include a nozzle configured to receive vacuum from the exterior to suck and grip an upper surface of the electronic component, and a moving part connected to the nozzle and configured to receive an electrical signal from the exterior to move the nozzle to a certain position along a moving path toward the PCB.

In addition, the component recognition module may include an image acquirer disposed at a side of the moving path, a first component recognition module, a second component recognition module, and a controller electrically connected to the nozzle module, the image acquirer, the first component recognition module and the second component recognition module. The controller may be configured to control the first component recognition module to transmit to the image acquirer an image recognizing the presence of the electronic component and the distance between the PCB and the nozzle, when the electronic component arrives at a first position corresponding to one of the at least one predetermined position on the moving path. The controller may be further configured to control the second component recognition module to simultaneously transmit to the image acquirer an image of a lower surface of the electronic component and at least one image of at least one side surface of the electronic component, when the electronic component arrives at a second position corresponding to another one of the at least one predetermined position on the moving path. The controller may also transmit an electrical signal to the lift device and receive positions of the electronic component from the position sensors.

Further, the first component recognition module may include a first light source disposed at a side of the moving path and configured to irradiate a first light to a mounting position on the PCB along a first light irradiation path, a second light source configured to irradiate a second light along a second light irradiation path in a direction inclined toward a side of the electronic component arrived at the first position, and a reflector disposed on a first light reflection path of the first light reflected from the mounting position and configured to further reflect the first light along the first light reflection path to the image acquirer. The reflector may be further configured to further reflect the second light reflected from the side of the electronic component along a second light reflection path to the image acquirer.

Furthermore, the reflector may include an incidence surface parallel to the moving path, a pair of reflection surfaces facing the incidence surface from different directions at a same inclination angle and having different lengths, and a second reflection surface configured to connect the pair of first reflection surfaces.

In addition, the first light following the first light reflection path may be introduced through the incidence surface to form a certain refraction and then reflected from the second reflection surface to be transmitted to the image acquirer, and the second light following the second light reflection path may be introduced through the incidence surface, and then, reflected from the pair of first reflection surfaces to be transmitted to the image acquirer.

Further, the second component recognition module may include a third light source disposed at a side of the moving path and configured to irradiate a light toward at least one edge of the electronic component arrived at the second position along a third light irradiation path, a first mirror disposed at a side of the moving path and configured to reflect the light reflected from the at least one side surface of the electronic component along a third light reflection path to transmit the third light to the image acquirer, a second mirror disposed at a side of the moving path in a direction inclined to the moving path, and a moving device connected to the second mirror and configured to receive an electrical signal from the controller to move the second mirror to the moving path so that the light reflected from the lower surface of the electronic component along the third light reflection path is transmitted to the image acquirer when the electronic component arrives at the second position.

Further, the nozzle module may include a nozzle module body, a lift device installed at the nozzle module body and configured to receive an electrical signal from the controller to be raised and lowered, a nozzle installed at a lower end of the lift device and configured to receive vacuum from the exterior to suck an upper surface of the electronic component, and at least one position sensor disposed at least one predetermined position at a side of the moving path and configured to measure the at least one given moving position of the electronic component. Here, the distance between the PCB and the nozzle module is a distance between the PCB and the nozzle.

In addition, the controller may preset a reference distance between the PCB and the nozzle at the first position or the second position, and at least one reference image of the at least one side surface of the electronic component and a reference image of the lower surface of the electronic component, and the controller may be electrically connected to an alarm generator configured to generate an alarm when the distance between the PCB and the nozzle at the first position or the second position recognized by the image acquirer is different from the reference distance between the PCB and the nozzle at the first position or the second position, respectively, when no image of the electronic component is acquired at the image acquirer from the third light transmitted to the image acquirer, or when at least one of the at least one image of the at least one side surface and the image of the lower surface recognized by the image acquirer is different from the reference images, respectively.

BRIEF DESCRIPTION OF THE DRAWINGS

Exemplary embodiments are described in further detail below with reference to the accompanying drawings. It should be understood that various aspects of the drawings may have been exaggerated for clarity.

DETAILED DESCRIPTION OF EXEMPLARY EMBODIMENTS

Figure 1:
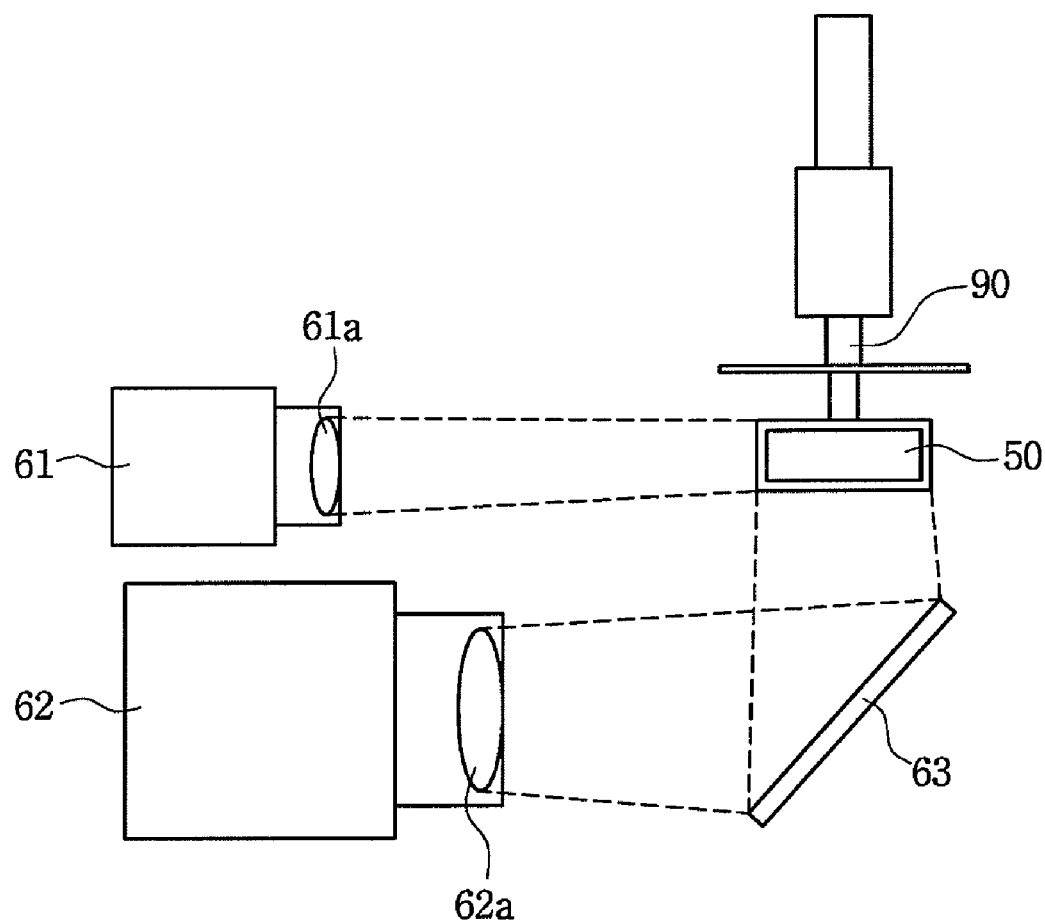
FIG. 1 illustrates a related art electronic component recognition apparatus.

Various exemplary embodiments will now be described more fully with reference to the accompanying drawings. In the drawings, the thicknesses of layers and regions may be exaggerated for clarity.

However, specific structural and functional details disclosed in the exemplary embodiments are merely representative for purposes of describing the exemplary embodiments. The present inventive concept, however, may be embodied in many alternate forms and should not be construed as limited to only the exemplary embodiments set forth herein.

Accordingly, the exemplary embodiments are capable of various modifications and alternative forms. It should be understood, however, that there is no intent to limit the exemplary embodiments to the particular forms disclosed, but on the contrary, the exemplary embodiments are to cover all modifications, equivalents, and alternatives falling within the scope of the present inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and may not be intended to be limiting other exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that spatially relative terms are intended to encompass different orientations of a device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

The exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, the exemplary embodiments should not be construed as being limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe the exemplary embodiments, various aspects will be described in detail with reference to the attached drawings. However, the present inventive concept is not limited to those exemplary embodiments as described.

Hereinafter, a head assembly for a chip mounter in accordance with the exemplary embodiments will be described with reference to the accompanying drawings.

Figure 2:
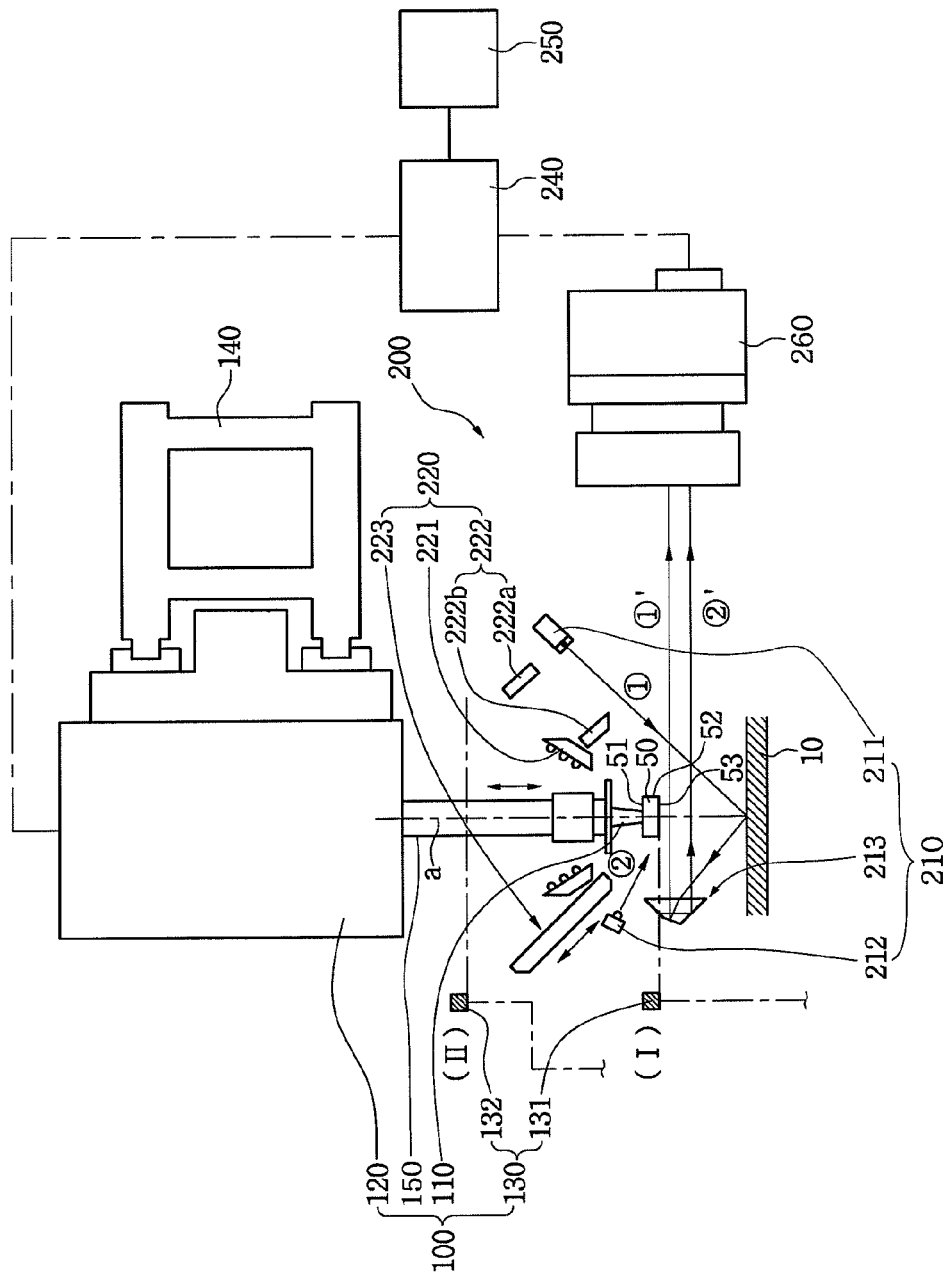
FIG. 2 illustrates an operation of a head assembly for a chip mounter, in accordance with an exemplary embodiment.
Figure 3:
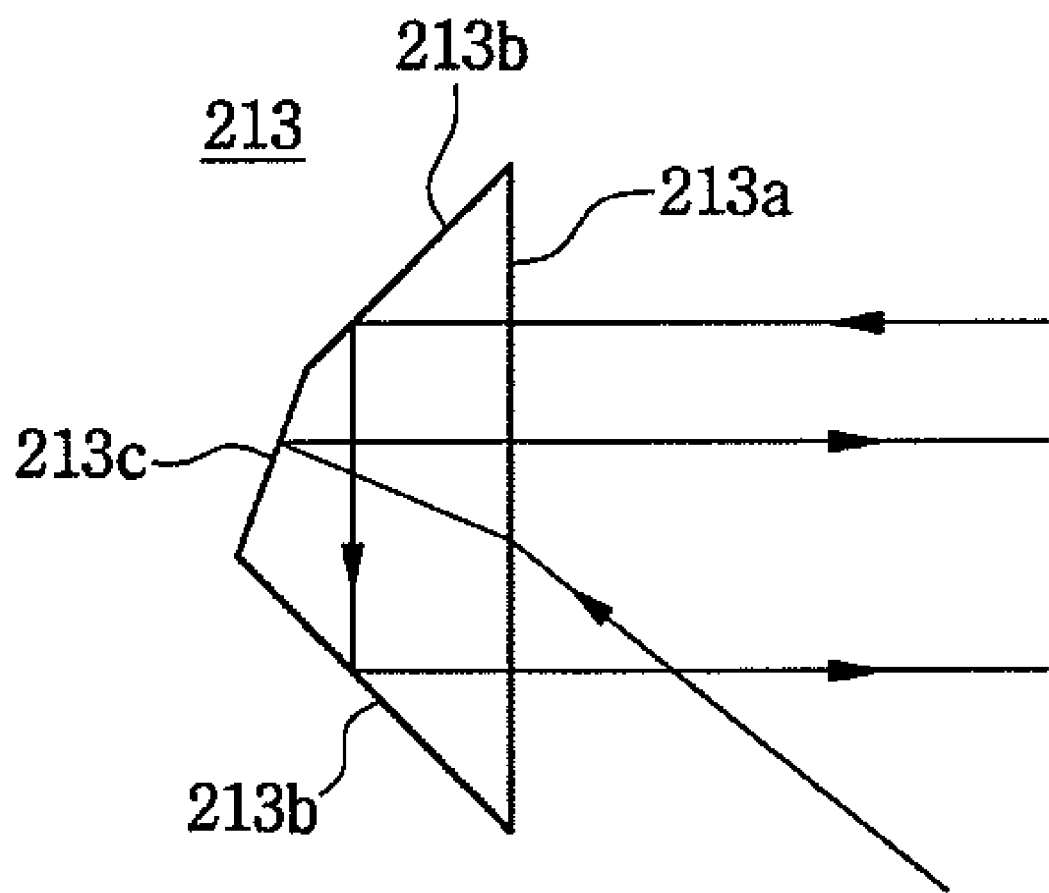
FIG. 3 illustrates a reflector 213 as shown in FIG. 2, in accordance with an exemplary embodiment.
Figure 4:
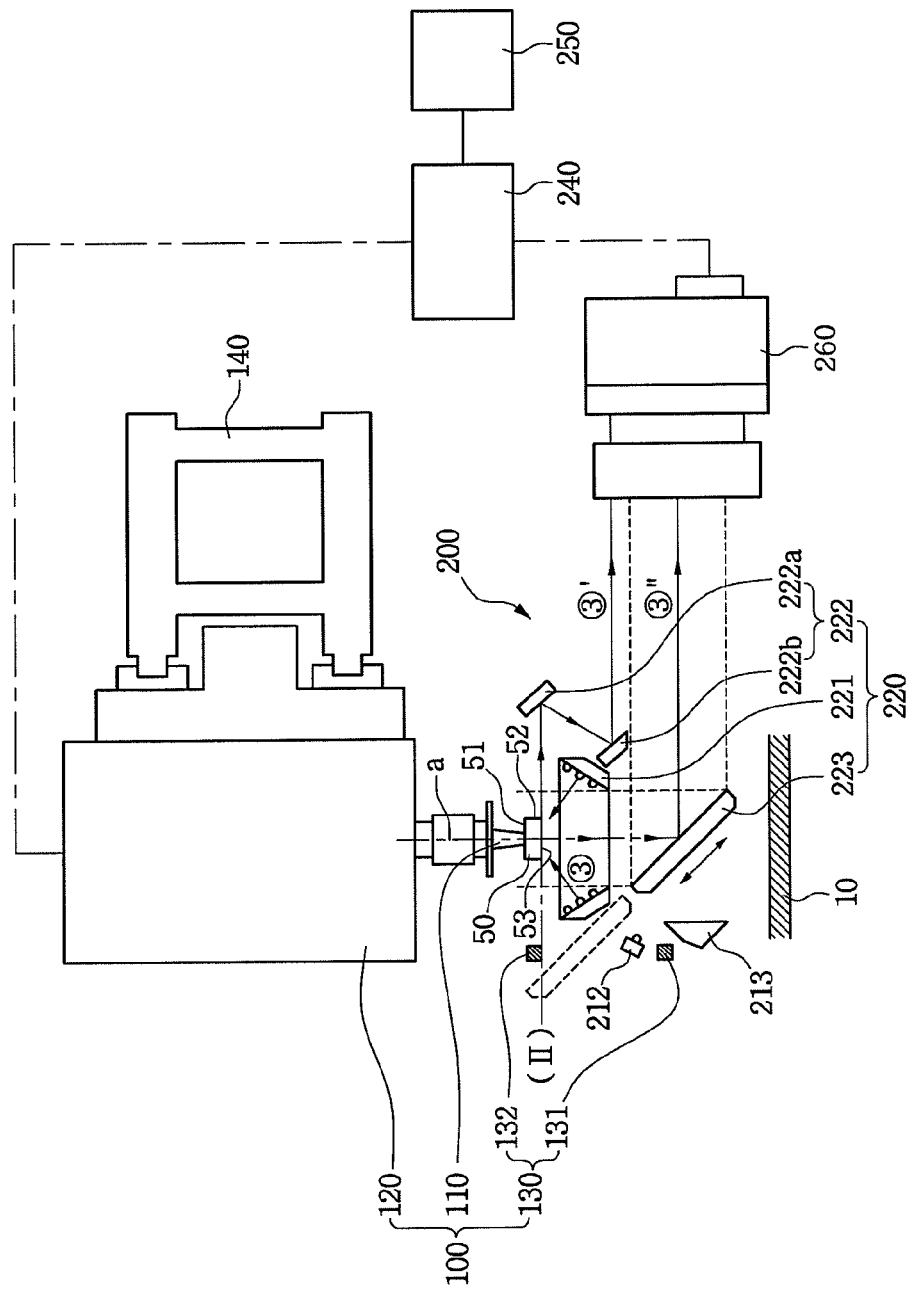
FIG. 4 illustrates an operation of the head assembly for a chip mounter, in accordance with another exemplary embodiment.
Figure 5:
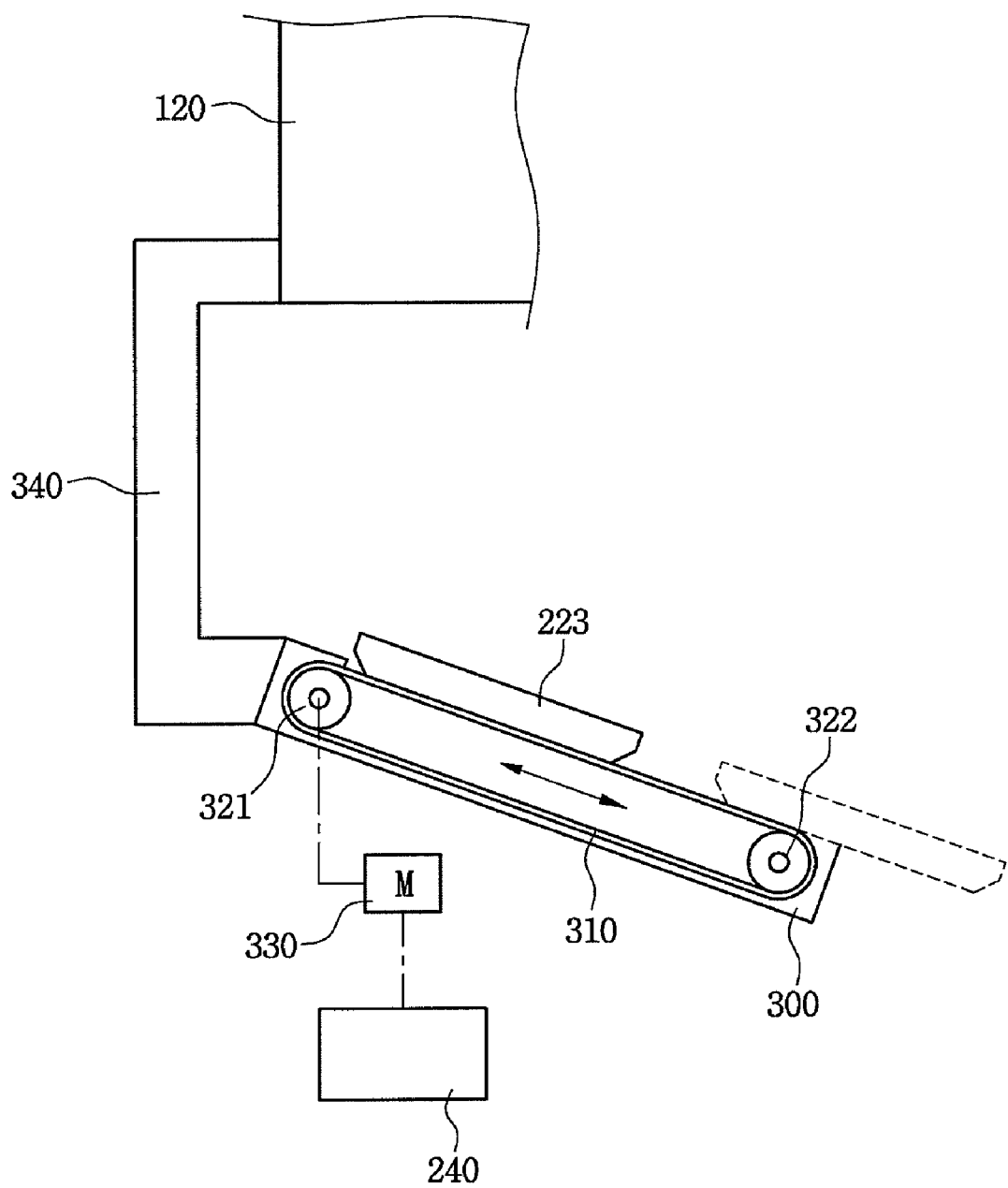
FIG. 5 illustrates an example of a position moving operation of a second mirror 223 as shown in FIG. 4, in accordance with an exemplary embodiment.
Figure 6:
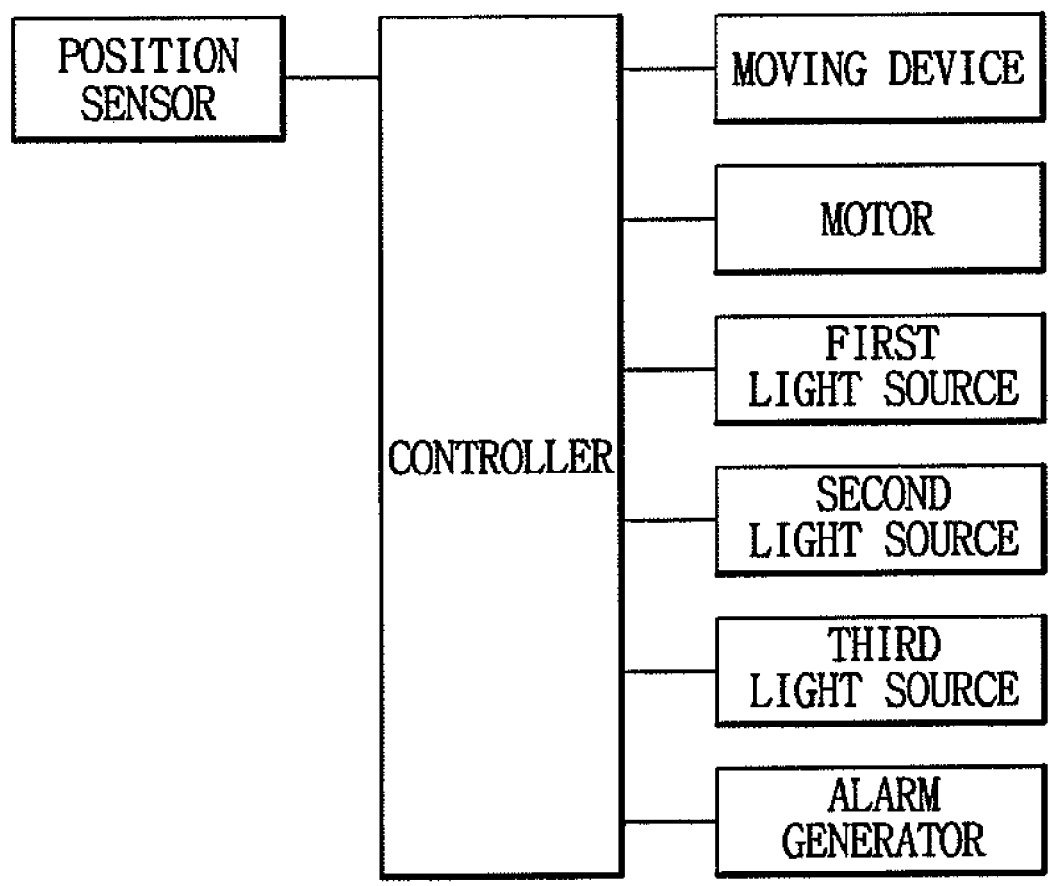
FIG. 6 is a block diagram of the head assembly for a chip mounter in accordance with an exemplary embodiment.

FIG. 2 is illustrates an operation of a head assembly for a chip mounter, in accordance with an exemplary embodiment. FIG. 3 illustrates a reflector 213 as shown in FIG. 2 according to an exemplary embodiment. FIG. 4 illustrates an operation of the head assembly for a chip mounter, in accordance with another exemplary embodiment. FIG. 5 illustrates an example of a position moving operation of a second mirror 223 as shown in FIG. 4. FIG. 6 is a block diagram of the head assembly for a chip mounter, in accordance with an exemplary embodiment.

First, a structure of the head assembly for a chip mounter in accordance with an exemplary embodiment will be described.

The head assembly for a chip mounter as shown in FIGS. 2, 4 and 6 in accordance with an exemplary embodiment is adapted to a chip mounting apparatus for receiving a plurality of electronic components from a component supplier (not shown) such as a tape feeder and sequentially picking up the supplied electronic components 50 to mount them on mounting positions of a PCB 10. In addition, the head assembly for a chip mounter may recognize presence of the picked up electronic component 50, and a side surface 52 and a lower surface 53 of the electronic component 50 to determine posture or alignment of the electronic component 50, and recognize a distance between a mounting position of the PCB 10, where the electronic component 50 is mounted, and a nozzle 110 of the head assembly as shown in FIG. 2.

The head assembly includes a nozzle module 100 disposed over the PCB 10 and configured to pick up and move the electronic component 50 to mount it on an upper surface of the PCB 10, and a component recognition module 200 electrically connected to the nozzle module 100 and configured to recognize presence of the electronic component 50, the height of the PCB 10 and alignment of the electronic component 50 at predetermined moving positions of a plurality of electronic components including the electronic component 50.

The nozzle module 100 includes a nozzle 110, a nozzle module body 120, a lift device 150, and position sensors 130.

Here, the nozzle module body 120 may be connected to a moving module 140 such as X and Y gentries.

In addition, the lift device 150 is installed at the nozzle module body 120 to receive an electrical signal from a controller 240, which will be described below, to be raised and lowered toward the PCB 10 along a moving path a. Here, the lift device 150 may be a pneumatic cylinder or an actuator.

A nozzle 110 is installed at a lower end of the lift device 150 to receive vacuum from the exterior to suck an upper surface 51 of the electronic component 50. The nozzle 110 has a nozzle hole (not shown), in which vacuum is formed, and the upper surface 51 of the electronic component 50 may be sucked an end of the nozzle 110 through the nozzle hole due to the vacuum.

A first position sensor 131 and a second position sensor 132 are disposed at predetermined positions I and II of a side of the moving path a, respectively, to measure a raising/lowering position of the electronic component 50. The first position I may be disposed at a lower level than the second position II with respect to the upper surface of the PCB 10.

In addition, the component recognition module 200 includes an image acquirer 260, first and second component recognition modules 210 and 220, and the controller 240.

The image acquirer 260 is disposed at a side of the moving path a. Here, the image acquirer 260 may be provided as a single device such as a camera.

The first component recognition module 210 may transmit to the image acquirer 260 an image recognizing suction of the electronic component 50 arrived at a level of the first position I by the end of the nozzle 110 and the height of the PCB 10, to the image acquirer 260.

The first component recognition module 210 includes a first light source 211 disposed at a side of the moving path a and configured to irradiate a first laser beam to the mounting position of the PCB 10 along a first light irradiation path ①, a second light source 212 configured to irradiate a second laser beam to the side surface 52 of the electronic component 50 arrived at the first position I along a second light irradiation path ② in an inclined direction, and a reflector 213 disposed on a first light reflection path ①' of the first laser beam reflected from the mounting position to further reflect the first laser beam to the image acquirer 260 along the first light reflection path ①'. The reflector 213 is also disposed on a second light reflection path ②' of the second laser beam reflected from the side surface 52 of the electronic component 50 to further reflect the second laser beam to the image acquirer 260 along the second light reflection path ②'.

Here, referring to FIGS. 2 and 3, the reflector 213 includes an incidence surface 213a parallel to the moving path a, a pair of first reflection surfaces 213b facing the incidence surface 213a from different directions at the same inclination angle and having different lengths, and a second reflection surface 213c formed between the pair of first reflection surfaces 213b to connect the pair of first reflection surfaces 213b.

Therefore, the first laser beam following the first light reflection path ①' is introduced through the incidence surface 213a to form a certain refraction, and then, reflected from the second reflection surface 213c to be transmitted to the image acquirer 260. In addition, the second laser beam following the second light reflection path ②' may be introduced through the incidence surface 213a, and then, reflected from the pair of first reflection surfaces 213b to be transmitted to the image acquirer 260.

In addition, the second component recognition module 220 may simultaneously transmit images of the lower surface 53 and the side surface 52 of the electronic component 50 arrived at the second position II to the image acquirer 260.

The second component recognition module 220 includes a third light source 221 disposed at a side of the moving path a and configured to irradiate a third laser beam toward an edge of the electronic component 50 arrived at the second position II along a third light irradiation path ③, a first mirror 222 disposed at the same side of the moving path a as the third light source 221 and configured to further reflect the third laser beam reflected from the side surface 52 of the electronic component 50 to the image acquirer 260 along a third light reflection path ③', a second mirror 223 disposed at a side of the moving path a and inclined with respect to the moving path a, and a moving device connected to the second mirror 223 and configured to receive an electrical signal from the controller 240 to move the second mirror 223 on the moving path a so that the third laser beam reflected from the lower surface 53 of the electronic component 50 along another third light reflection path ③'' is transmitted to the image acquirer 260 when the electronic component 50 arrives at the second position II. As shown in FIGS. 2 and 3, the second component recognition module 220 may include a plurality of third light sources 221, instead of one third light source 221, disposed around the moving path a and irradiating a plurality of third laser beams toward a plurality of edges of the electronic component 50 arrived at the second position II along a plurality of third light irradiation paths ③, respectively, to generate the third laser beams reflected at a plurality of side surfaces 52 and the lower surface 53 of the electronic component 50.

As shown in FIG. 5, the moving device may include a moving belt 310 disposed at a side of the moving path a in a downwardly inclined direction at a certain angle, first and second drive gears 321 and 322 configured to support both ends of the moving belt 310, a rotary motor 330 configured to rotate the first drive gear 321, a guide 300 configured to cover the moving belt 310, and a bracket 340 configured to fix the guide 300 to the nozzle module body 120. The second mirror 223 may be fixed to one surface of the moving belt 310. Therefore, the second mirror 223 may be raised and lowered depending on a moving direction of the moving belt 310.

Further, the controller 240 is electrically connected to the nozzle module 100, the image acquirer 260, the first component recognition module 210 and the second component recognition module 220. The controller 240 may operate the first component recognition module 210 when the electronic component 50 arrives at a level of the predetermined first position I on the moving path a, operate the second component recognition module 220 when the electronic component 50 arrives at a level of the predetermined second position II of the moving path a, and transmit an electrical signal to the lift device 150 and receive a position of the electronic component 50 from the position sensors 130.

Further, the controller 240 presets a reference height of the PCB 10 and a reference image(s) of the side surface(s) 52 and the lower surface 53 of the electronic component 50.

The controller 240 is electrically connected to an alarm generator 250 configured to generate an alarm when the height of the PCB 10 recognized by the image acquirer 260 is different from the reference height, no image of the electronic component 50 is acquired at the image acquirer 260 from the third laser beam transmitted to the image acquirer 260, or the image(s) of the side surface(s) 52 and the lower surface 53 of the electronic component 50 recognized by the image acquirer 260 are different from the reference image(s).

Hereinafter, operation of the head assembly for a chip mounter constituted as above will be described, according to an exemplary embodiment.

Referring to FIGS. 2 to 6, the electronic component 50 may be sucked by an end of the nozzle 110 using vacuum formed in a nozzle hole in the nozzle 110. Here, the sucked surface is the upper surface 51 of the electronic component 50, and the side surfaces 52 and the lower surface 53 of the electronic component 50 are entirely exposed to the exterior.

In addition, the lift device 150 configured to raise and lower the nozzle 110 may be raised and lowered along the moving path a perpendicular to the PCB 10.

The controller 240 may transmit an electrical signal to the lift device 150. Then, the lift device 150 lowers the nozzle 110 along the moving path a.

At this time, the first position sensor 131 disposed at the first position I recognizes the electronic component 50 moved to a level of the first position I, and transmits an electrical signal thereof.

Next, the controller 240 may transmit an electrical signal to the lift device 150 to stop operation of the lift device 150. Therefore, the electronic component 50 sucked by the nozzle 110 may be in a state as shown in FIG. 2, in which the lower surface 53 arrives at a level of the first position I.

Then, the controller 240 operates the first light source 211 to irradiate a first laser beam having a certain intensity of illumination along the first light irradiation path ① toward the mounting position of the PCB 10. In addition, the laser first beam following the first light irradiation path ① is reflected at the mounting position to be introduced onto the incidence surface 213a of the reflector 213. Further, the first laser beam passes through the incidence surface 213a to be refracted at a certain angle and introduced onto the second reflection surface 213c, and then, reflected from the second reflection surface 213c along the first light reflection path ①'. Further, the first laser beam following the first light reflection path ①' may be recognized by the image acquirer 260. In addition, the image acquirer 260 may transmit an image of the recognized first laser beam to the controller 240. Therefore, the controller 240 may recognize the position of the first light source 211 in order to recognize the distance between the mounting position of the PCB 10 and the nozzle 110.

In addition, the controller 240 operates the second light source 212, disposed at a side of the moving path a, to irradiate a second laser beam to a side surface of the electronic component 50 sucked by the end of the nozzle 110 along the second light irradiation path ②.

Further, the second laser beam following the second light irradiation path ② is reflected from the side surface of the electronic component 50 to be perpendicularly introduced onto the incidence surface 213a of the reflector 213. The second laser beam perpendicularly introduced onto the incidence surface 213a is reflected from an inner surface of the first reflection surface 213b to be reflected from the other inner surface of the first reflection surface 213b, and then, transmitted to the image acquirer 260 along the second light reflection path ②'. Further, the image acquirer 260 transmits the image made by the laser beam to the controller 240. Therefore, the controller 240 may recognize that the electronic component 50 is sucked by the end of the nozzle 110 at the level of the first position I. That is, the controller 240 may determine whether the electronic component 50 is at the level of the first position I.

As described above, after recognition of presence of the electronic component 50 at the first position I and the distance between the nozzle 110 of the head assembly and the mounting position of the PCB 10, the controller 240 may determine alignment of the electronic component 50.

Referring to FIG. 4, the controller 240 operates the lift device 150 to raise the nozzle 110 to a certain position. At this time, the second position sensor 132 disposed at the second position II at the side of the moving path a may recognize the electronic component 50 sucked and raised by the nozzle 110.

That is, the second position sensor 132 transmits an electrical signal to the controller 240 when the electronic component 50 is positioned at a level of the second position II. Then, the controller 240 may transmit an electrical signal to the lift device 150 to immediately stop operation of the lift device 150.

Next, the controller 240 moves the second mirror 223 disposed at the side of the moving path a to be positioned under the nozzle 110.

Referring to FIGS. 4 and 5, for example, the controller 240 transmits an electrical signal to the rotary motor 330. In addition, the first drive gear 321 connected to the rotary motor 330 is rotated, and the moving belt 310 connected to the first drive gear 321 at its one end is rotated in a state in which the other end is connected to the second drive gear 322. Here, since the second mirror 223 is fixed to an upper surface of the moving belt 310, the second mirror 223 may be linked to the moving operation of the moving belt 310.

Therefore, the moving operation of the moving belt 310 may move the second mirror 223 from an original position (a dotted line) to an operation position (a solid line) as shown in FIG. 4.

In addition, the controller 240 operates the third light source 221 to irradiate a third laser beam toward a lower edge of the electronic component 50 along the third light irradiation path ③ in an inclined direction.

The third laser beam following the third light irradiation path ③ may form a first path directed to the second mirror 223 along the moving path a after reflection by the lower surface 53 of the electronic component 50, and form a second path directed to the first mirror 222 after reflection by a side surface of the electronic component 50.

The third laser beam directed to the second mirror 223 along the first path is reflected from the second mirror 223 to be transmitted to the image acquirer 260 along the third light reflection path ③''.

Further, the third laser beam directed to the first mirror 222 along the second path is first directed by the side surface 52 of the electronic component 50 to be reflected from an upper mirror 222a, and then, reflected from a lower mirror 222b disposed thereunder. Next, the third laser beam reflected from the lower mirror 222b is transmitted to the image acquirer 260 along the other third light reflection path ③'.

Therefore, the controller 240 may simultaneously receive the images of the lower surface 53 and the side surface 52 of the electronic component 50.

Then, the controller 240 may determine alignment of the electronic component 50.

That is, the controller 240 may set a reference distance between the PCB 10 and the nozzle 110, and reference images of the side surface(s) 52 and the lower surface 53 of the electronic component 50.

Therefore, the controller 240 may determine whether the distance between the PCB 10 and the nozzle 110 recognized by the image acquirer 260 is equal to the above reference distance. In addition, the controller 240 may determine presence of the electronic component 50. Further, the controller 240 may determine whether the images of the side surface(s) 52 and the lower surface 53 of the electronic component 50 recognized by the image acquirer 260 are equal to the reference images.

As a result, the controller 240 may transmit an electrical signal to the alarm generator 250 to generate an alarm when the distance between the PCB 10 and the nozzle 110 recognized by the image acquirer 260 is different from the reference distance, no image of the electronic component 50 is acquired at the image acquirer 260 from the third laser beam transmitted to the image acquirer 260, or the images of the side surface(s) 52 and the lower surface 53 of the electronic component 50 recognized by the image acquirer 260 are different from the reference images.

According to the above exemplary embodiments, a head assembly for a chip mounter may recognize presence of an electronic component sucked by a nozzle, posture of the electronic component based on a lower surface and a side surface(s) of the electronic component, and a distance between the nozzle and a mounting position of a PCB on which the electronic component is mounted.

The foregoing is illustrative of exemplary embodiments and is not to be construed as limiting thereof. Although a few exemplary embodiments have been described, those skilled in the art will readily appreciate that many modifications are possible in implementing the present inventive concept without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A head assembly for a chip mounter comprising:
   a nozzle module disposed above a printed circuit board (PCB) and configured to suck and move an electronic component to mount the electronic component on the PCB along a moving path of a lift device of the nozzle module; and
   a component recognition module electrically connected to the nozzle module and configured to recognize presence of the electronic component, a distance between the PCB and the nozzle module when the electronic component is at a first position located above the PCB and on the moving path, and alignment of the electronic component when the electronic component is at a second position located higher in height than the first position and located on the moving path,
   wherein the moving path is formed perpendicular to a surface where the electronic component is mounted on the PCB, wherein the nozzle module comprises:
a nozzle module body;
the lift device installed at the nozzle module body and configured to receive an electrical signal from an exterior to be raised and lowered along the moving path toward the PCB;
a nozzle installed at a lower end of the lift device and configured to suck the electronic component; and
two position sensors disposed at the first position and the second position at at least one side of the moving path, located under the nozzle module, and configured to measure at least one given moving position of the electronic component.

2. The head assembly according to claim 1, further comprising a controller, wherein the component recognition module comprises:
an image acquirer disposed at the side of the moving path;
a first component recognition module; and
a second component recognition module,
wherein the controller controls the first component recognition module to transmit to the image acquirer an image recognizing the presence of the electronic component and the distance between the PCB and the nozzle, when the electronic component arrives at the first position of the moving path,
wherein the controller further controls the second component recognition module to simultaneously transmit to the image acquirer an image of a lower surface of the electronic component and at least one image of at least one side surface of the electronic component, when the electronic component arrives at the second position of the moving path, and
wherein the controller transmits an electrical signal to the lift device and receives the positions of the electronic component from the position sensors.

3. The head assembly according to claim 2, wherein the second component recognition module comprises:
a third light source disposed at the side of the moving path and configured to irradiate a light toward at least one edge of the electronic component arrived at the second position along a third light irradiation path;
a first mirror disposed at the side of the moving path and configured to reflect the light reflected from the at least one side surface of the electronic component along a third light reflection path to transmit the third light to the image acquirer;
a second mirror disposed at the side of the moving path in a direction inclined to the moving path; and
a moving device connected to the second mirror and configured to receive an electrical signal from the controller to move the second mirror to the moving path so that the light reflected from the lower surface of the electronic component along the third light reflection path is transmitted to the image acquirer when the electronic component arrives at the second position.

4. The head assembly according to claim 2, wherein the controller presets a reference distance between the PCB and the nozzle at the first position or the second position, and at least one reference image of the at least one side surface of the electronic component and a reference image of the lower surface of the electronic component, and
wherein the controller is electrically connected to an alarm generator configured to generate an alarm:
if the distance between the PCB and the nozzle at the first position or the second position recognized by the image acquirer is different from the reference distance between the PCB and the nozzle at the first position or the second position, respectively,
if no image of the electronic component is acquired at the image acquirer from the third light transmitted to the image acquirer, or
if at least one of the at least one image of the at least one side surface and the image of the lower surface recognized by the image acquirer is different from the reference images, respectively.

5. The head assembly according to claim 2, wherein the first component recognition module comprises:
a first light source disposed at the side of the moving path and configured to irradiate a first light to a mounting position on the PCB along a first light irradiation path;
a second light source configured to irradiate a second light along a second light irradiation path in a direction inclined toward a side of the electronic component arrived at the first position; and
a reflector disposed on a first light reflection path of the first light reflected from the mounting position and configured to further reflect the first light along the first light reflection path to the image acquirer,
wherein the reflector is further configured to further reflect the second light reflected from the side of the electronic component along a second light reflection path to the image acquirer.

6. The head assembly according to claim 5, wherein the reflector comprises:
an incidence surface parallel to the moving path;
a pair of reflection surfaces facing the incidence surface from different directions at a same inclination angle and having different lengths; and
a second reflection surface configured to connect the pair of first reflection surfaces, and
wherein the first light following the first light reflection path is introduced through the incidence surface to form a certain refraction, and then, reflected from the second reflection surface to be transmitted to the image acquirer, and the second light following the second light reflection path is introduced through the incidence surface, and then, reflected from the pair of first reflection surfaces to be transmitted to the image acquirer.

7. The head assembly according to claim 6, wherein the second component recognition module comprises:
a third light source disposed at the side of the moving path and configured to irradiate a light toward at least one edge of the electronic component arrived at the second position along a third light irradiation path;
a first mirror disposed at the side of the moving path and configured to reflect the light reflected from the at least one side surface of the electronic component along a third light reflection path to transmit the third light to the image acquirer;
a second mirror disposed at the side of the moving path in a direction inclined to the moving path; and
a moving device connected to the second mirror and configured to receive an electrical signal from the controller to move the second mirror to the moving path so that the light reflected from the lower surface of the electronic component along the third light reflection path is transmitted to the image acquirer when the electronic component arrives at the second position.

8. The head assembly according to claim 7, wherein the controller presets a reference distance between the PCB and the nozzle at the first position or the second position, and at least one reference image of the at least one side surface of the electronic component and a reference image of the lower surface of the electronic component, and wherein the controller is electrically connected to an alarm generator configured to generate an alarm:

if the distance between the PCB and the nozzle at the first position or the second position recognized by the image acquirer is different from the reference distance between the PCB and the nozzle at the first position or the second position, respectively, if no image of the electronic component is acquired at the image acquirer from the third light transmitted to the image acquirer, or if at least one of the at least one image of the at least one side surface and the image of the lower surface recognized by the image acquirer is different from the reference images, respectively.

9. A head assembly for a chip mounter comprising:

a nozzle disposed above a printed circuit board (PCB) and configured to suck and move an electronic component to mount the electronic component on the PCB;

a component recognition module electrically connected to the nozzle and configured to recognize a status of the electronic component, the nozzle and the PCB at at least one position of the electronic component sucked by the nozzle above the PCB; and an information collecting unit, wherein the status comprises presence of the electronic component in a state of being sucked by the nozzle, a distance between the PCB and the nozzle when the electronic component is sucked by the nozzle, and alignment of the electronic component in the state of being sucked by the nozzle, wherein the component recognition module transmits to the information collecting unit information on the presence of the electronic component and the distance, when the electronic component sucked by the nozzle is positioned at a first position of the at least one position, and wherein the component recognition module transmits to the information collecting unit information on the alignment of the electronic component based on information on a lower surface of the electronic component and at least one side surface of the electronic component, when the electronic component sucked by the nozzle is positioned at a second position of the at least one position.

\* \* \* \* \*